United States Patent
Cheng

(10) Patent No.: US 8,189,415 B2
(45) Date of Patent: May 29, 2012

(54) SENSING AMPLIFIER APPLIED TO AT LEAST A MEMORY CELL, MEMORY DEVICE, AND ENHANCEMENT METHOD FOR BOOSTING THE SENSING AMPLIFIER THEREOF

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 184 days.

(21) Appl. No.: 12/573,155

(22) Filed: Oct. 5, 2009

(65) Prior Publication Data
US 2011/0080793 A1    Apr. 7, 2011

(51) Int. Cl.
*G11C 7/00* (2006.01)
*G11C 7/02* (2006.01)
(52) U.S. Cl. .................. 365/207; 365/205; 365/189.11
(58) Field of Classification Search ............. 365/189.11, 365/185.12, 196, 207, 205
See application file for complete search history.

(56) References Cited

U.S. PATENT DOCUMENTS

| 4,914,631 | A  | * | 4/1990  | Johnson et al. | 365/189.11 |
| 7,630,260 | B2 | * | 12/2009 | Kobayashi      | 365/203    |
| 2006/0215438 | A1 | * | 9/2006 | Suzuki        | 365/145    |
| 2009/0147604 | A1 | * | 6/2009 | Kang          | 365/205    |

\* cited by examiner

*Primary Examiner* — VanThu Nguyen
*Assistant Examiner* — Khamdan Alrobaie
(74) *Attorney, Agent, or Firm* — Winston Hsu; Scott Margo

(57) ABSTRACT

A sensing amplifier consists of a sensing circuit, a boosting circuit, at least one bit-line isolating circuit, and at least a P-sensing enhancement circuit. The sensing circuit is disposed between a sensing line and a complementary sensing line. The boosting circuit boosts the sensing line and the complementary sensing line during a boosting stage. The bit-line isolating circuit is coupled to the sensing circuit for controlling whether to isolate a bit line/complementary bit line from the sensing line/complementary sensing line. The P-sensing enhancement circuit is coupled to the sensing line, the complementary sensing line, and a reference voltage. When the bit-line isolating circuit isolates the bit line from the sensing line and isolates the complementary bit line from the complementary sensing line, a voltage level of the bit line or the complementary bit line is pulled up to the reference voltage by the P-sensing enhancement circuit during an enhancement stage.

17 Claims, 4 Drawing Sheets

SENSING AMPLIFIER APPLIED TO AT LEAST A MEMORY CELL, MEMORY DEVICE, AND ENHANCEMENT METHOD FOR BOOSTING THE SENSING AMPLIFIER THEREOF

BACKGROUND OF THE INVENTION

1. Field of the Invention

The present invention relates to a sensing amplifier, a memory device and a related enhancement method for boosting the sensing amplifier, and more particularly, to a sensing amplifier and related apparatus and enhancement method for boosting the sensing amplifier by making use of a P-sensing enhancement circuit to boost a voltage level of a bit line or a complementary bit line to a reference voltage when the bit line as well as the complementary bit line are isolated from the sensing amplifier.

2. Description of the Prior Art

A semiconductor memory can be divided into two categories: a volatile memory, e.g. a dynamic random access memory (DRAM), and a non-volatile memory. The difference between these categories is whether the stored data can be reserved for a long time when external electric power is turned off. The data stored in the DRAM will disappear but the data stored in the non-volatile memory will be preserved.

Please refer to FIG. 1 (including 1A and 1B). 1A is a simplified diagram of a memory device 100 according to the prior art, and 1B is a diagram showing a problem resulted in the sensing amplifier 130 of the memory device 100. As shown in 1A, the memory device 100 includes at least one memory array 110 and 120, a sensing amplifier 130, a first switch circuit 140, a second switch circuit 150, and a boosting circuit 190. The boosting circuit 190 is disposed between the sensing amplifier 130 and the first switch circuit 140 for boosting a sensing line/complementary sensing line SA/bSA during a boosting stage. The first switch circuit 140 is disposed between the sensing amplifier 130 and the memory array 110 for determining whether to isolate a bit line/complementary bit line BL/bBL from a sensing line/complementary sensing line SA/bSA. The second switch circuit 150 is disposed between the sensing amplifier 130 (via the boosting circuit 190) and the memory array 120 for determining whether to isolate another bit line/complementary bit line from the sensing line/complementary sensing line SA/bSA. Be noted that a parasitic capacitor C2 located on the bit line/complementary bit line BL/bBL is usually greater than a parasitic capacitor C1 located on the sensing line/complementary sensing line SA/bSA.

In 1B of FIG. 1, it shows a traditional waveform of the boosted sensing line/complementary sensing line SA/bSA together with the bit line/complementary bit line BL/bBL. At first, the second switch circuit 150 is turned off and the first switch circuit 140 is turned on. At this time, the bit line BL and the complementary bit line bBL start to develop, which is also labeled as a duration T1. And then the first switch circuit 140 is turned off, so that the bit line BL is isolated from the sensing line SA and the complementary bit line bBL is isolated from the complementary sensing line bSA, which is also labeled as a duration T2. During the duration T2 (which is also called as the boosting stage), the sensing line SA and the complementary sensing line bSA are boosted by the boosting circuit 190. Afterwards, the complementary sensing line bSA is pulled up from ½ VbLH to VbLH while the sensing line SA is pulled down from ½ VbLH to 0 during a duration T3. After that, the first switch circuit 140 is turned on again, so that the bit line BL is re-connected to the sensing line SA and the complementary bit line bBL is re-connected to the complementary sensing line bSA, which is also labeled as a duration T4. During the duration T4, the sensing line/complementary sensing line SA/bSA and the bit line/complementary bit line BL/bBL will have charge sharing. As can be seen from 1B of FIG. 1, because the parasitic capacitor C2 located on the bit line/complementary bit line BL/bBL is much bigger than the parasitic capacitor C1 located on the sensing line/complementary sensing line SA/bSA, a great glitch may appear in the bit line/complementary bit line BL/bBL. This may cause false sensing and may increase the recovery time of the bit line/complementary bit line BL/bBL.

Hence, how to overcome such problem, resulted from the glitch appeared in the bit line/complementary bit line BL/bBL in the sensing amplifier of the memory device, has become an important topic of the field.

SUMMARY OF THE INVENTION

It is one of the objectives of the claimed invention to provide a sensing amplifier, a memory device and a related enhancement method for boosting the sensing amplifier to solve the abovementioned problems.

According to one embodiment, an enhancement method for boosting a sensing amplifier applied to at least a memory cell is provided. The sensing amplifier is disposed between a sensing line and a complementary sensing line, and the memory cell is coupled to a bit line or a complementary bit line. The enhancement method includes the steps of: isolating the bit line from the sensing line, and isolating the complementary bit line from the complementary sensing line; when the bit line is isolated from the sensing line and the complementary bit line is isolated from the complementary sensing line, boosting the bit line and the complementary bit line during a boosting stage; and pulling up a voltage level of the bit line or the complementary bit line to the reference voltage by a P-sensing enhancement circuit during an enhancement stage when the bit line is isolated from the sensing line and the complementary bit line is isolated from the complementary sensing line, wherein the P-sensing enhancement circuit is coupled to the sensing line, the complementary sensing line, and a reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
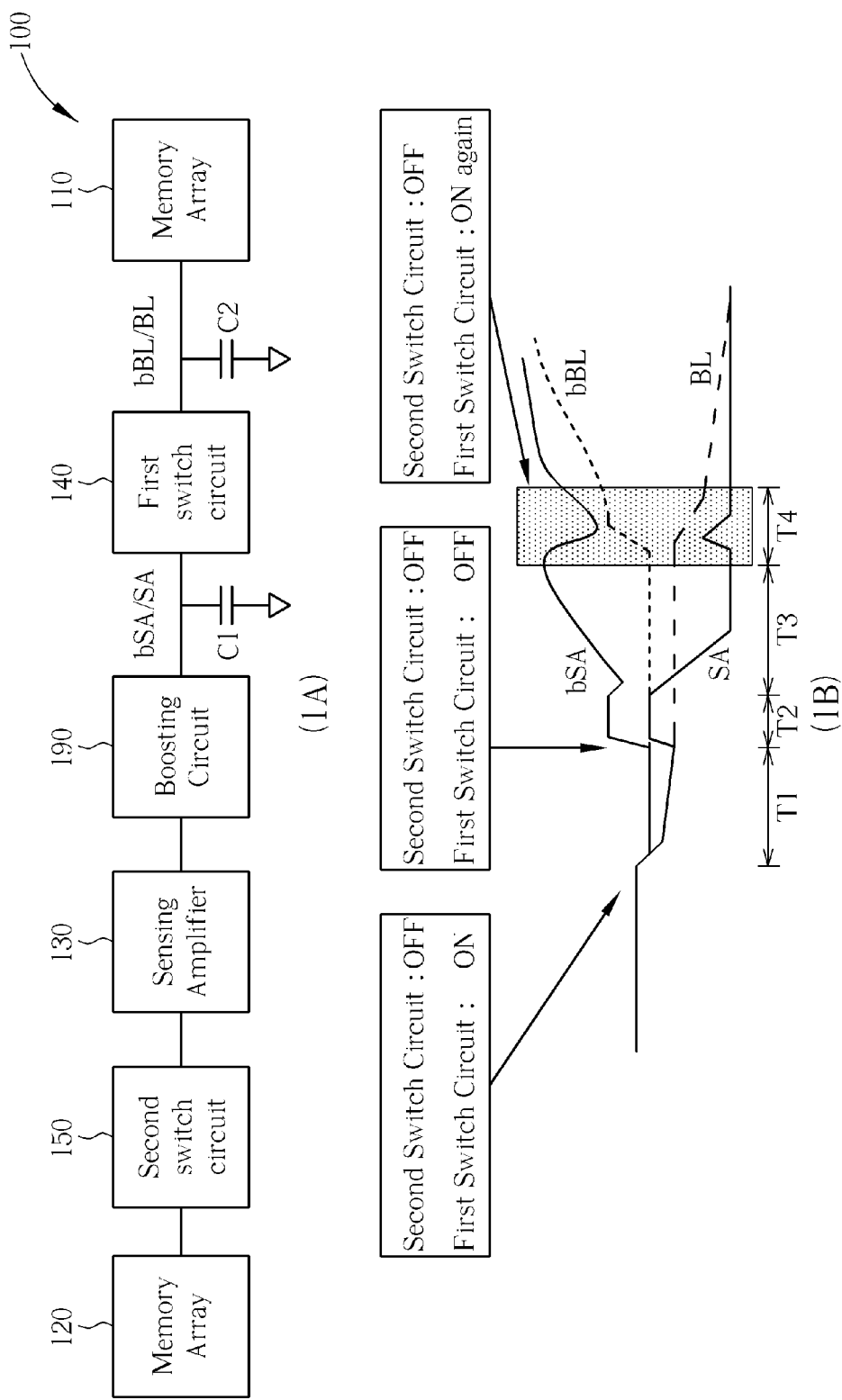
FIG. 1 (including 1A and 1B) is a diagram showing a problem resulted in a sensing amplifier of a memory device according to the prior art.
Figure 2:
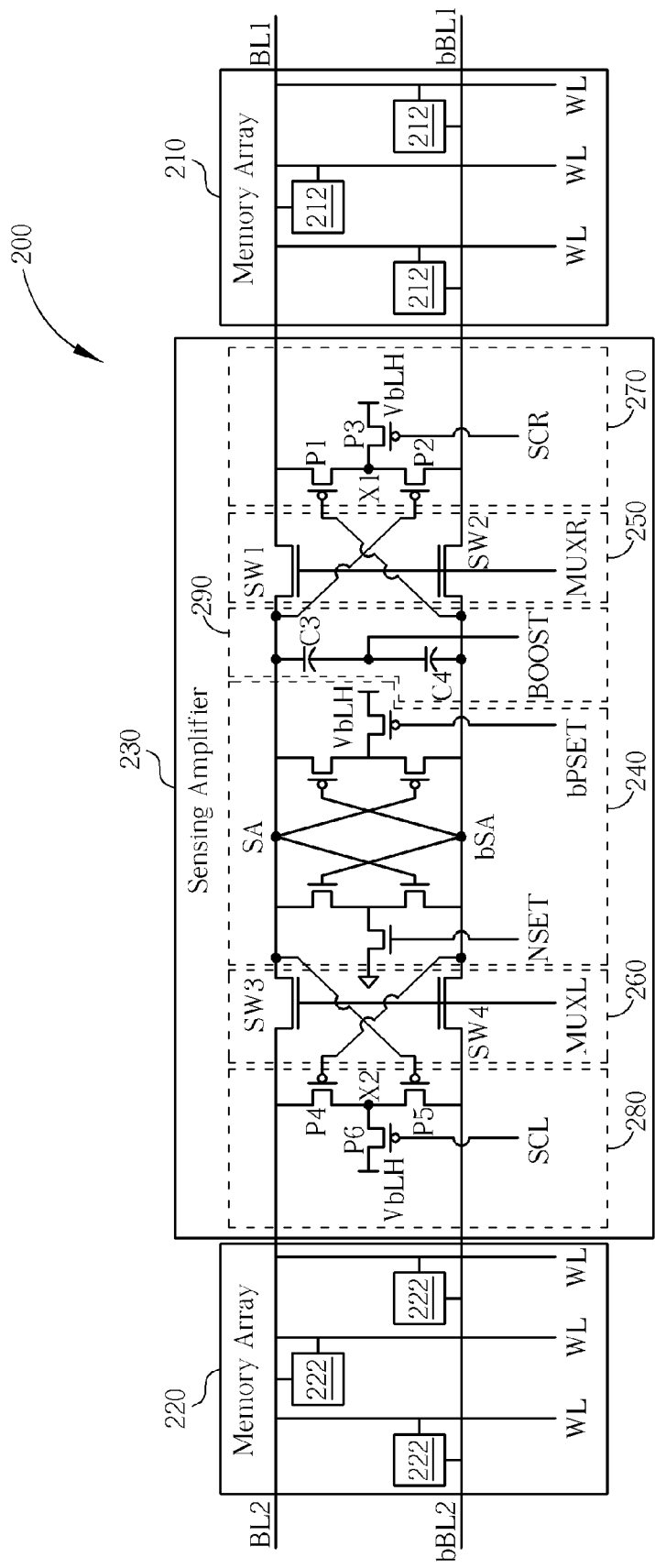
FIG. 2 is a diagram of a memory device according to an embodiment of the present invention.

Please refer to FIG. 2. FIG. 2 is a diagram of a memory device 200 according to an embodiment of the present invention. Please note that the memory device 200 can be implemented by a dynamic random access memory (DRAM), but this should not be considered as limitations of the present invention. As shown in FIG. 2, the memory device 200 includes, but is not limited to, at least one memory array 210 and 220 and a sensing amplifier 230. Each of the memory arrays 210 and 220 consists of at least a memory cell 212 and 222, wherein each of the memory cells 212 is coupled to a bit line BL1 or a complementary bit line bBL1 while each of the memory cells 222 is coupled to another bit line BL2 or another complementary bit line bBL2. The sensing amplifier 230 consists of a sensing circuit 240, a boosting circuit 290, a first bit-line isolating circuit 250, a second bit-line isolating circuit 260, a first P-sensing enhancement circuit 270, and a second P-sensing enhancement circuit 280. The sensing circuit 240 is disposed between a sensing line SA and a complementary sensing line bSA for updating data or accessing data of the memory cell 212 or 222. The boosting circuit 290 is coupled to the sensing line SA, the complementary sensing line bSA, and the sensing circuit 240. The first bit-line isolating circuit 250 is coupled between the sensing circuit 240 (via the boosting circuit 290) and the memory cell 212 of the memory array 210 for controlling whether to isolate the bit line BL1 from the sensing line SA and for controlling whether to isolate the complementary bit line bBL1 from the complementary sensing line bSA. The first P-sensing enhancement circuit 270 is coupled to the sensing line SA, the complementary sensing line bSA, and a reference voltage VbLH. When the first bit-line isolating circuit 250 isolates the bit line BL1 from the sensing line SA and isolates the complementary bit line bBL1 from the complementary sensing line bSA, a voltage level of the bit line BL1 or the complementary bit line bBL1 is pulled up to the reference voltage VbLH by the first P-sensing enhancement circuit 270 during an enhancement stage.

Be noted that the sensing circuit 240 of the sensing amplifier 230 is well documented and is already shown in FIG. 2; therefore, it will not be described in detail. In addition, the boosting circuit 290 consists of two capacitors C3 and C4, wherein the capacitors C3 and C4 are controlled by a boosting signal BOOST. When the boosting signal BOOST is logic high, the two capacitors C3 and C4 are charged during the boosting stage.

Furthermore, the first bit-line isolating circuit 250 includes a first switch SW1 and a second switch SW2. The first switch SW1 is coupled between the bit line BL1 and the sensing line SA for controlling whether to isolate the bit line BL1 from the sensing line SA. The second switch SW2 is coupled between the complementary bit line bBL1 and the complementary sensing line bSA for controlling whether to isolate the complementary bit line bBL1 from the complementary sensing line bSA. That is, if both the first switch SW1 and the second switch SW2 are turned off via a switch signal MUXR, the bit line BL1 is isolated from the sensing line SA as well as the complementary bit line bBL1 is isolated from the complementary sensing line bSA. If both the first switch SW1 and the second switch SW2 are turned on via the switch signal MUXR, the bit line BL1 is connected/re-connected to the sensing line SA as well as the complementary bit line bBL1 is connected/re-connected to the complementary sensing line bSA.

In this embodiment, each of the first switch SW1 and the second switch SW2 is implemented by an N-type transistor, but the present invention is not limited to this only.

In addition, the first P-sensing enhancement circuit 270 consists of a first transistor P1, a second transistor P2, and a third transistor P3. The first transistor P1 has a first end coupled to the bit line BL1, a second end coupled to a first node X1, and a control end coupled to the complementary sensing line bSA. The second transistor P2 has a first end coupled to the first node X1, a second end coupled to the complementary bit line bBL1, and a control end coupled to the sensing line SA. The third transistor P3 has a first end coupled to the reference voltage VbLH, a second end coupled to the first node X1, and a control end for receiving a first control signal SCR. When the first bit-line isolating circuit 250 isolates the bit line BL1 from the sensing line SA and isolates the complementary bit line bBL1 from the complementary sensing line bSA, the third transistor P3 is turned on by the first control signal SCR. At this time, the first transistor P1 as well as the second transistor P2 are turned on to help to pull up the voltage level of the bit line BL1 or the complementary bit line bBL1 to the reference voltage VbLH during the enhancement stage. After the first bit-line isolating circuit 250 re-connects the bit line BL1 to the sensing line SA and re-connects the complementary bit line bBL1 to the complementary sensing line bSA, the third transistor P3 is turned off by the first control signal SCR. At this time, both the first transistor P1 and the second transistor P2 are turned off by the third transistor P3 to avoid current leakage.

Similarly, the connection manner of the second bit-line isolating circuit 260 (including a third switch SW3 and a fourth switch SW4) as well as the second P-sensing enhancement circuit 280 (including three transistors P4, P5, and P6) is similar to that of the first bit-line isolating circuit 250 as well as the first P-sensing enhancement circuit 270 and is already shown in FIG. 2, and further description is therefore omitted here for brevity. In addition, the operating manner of the second P-sensing enhancement circuit 280 (including the transistors P4, P5, and P6) is similar to that of the first P-sensing enhancement circuit 270, wherein the second P-sensing enhancement circuit 280 is used for helping to pull up a voltage level of the bit line BL2 or the complementary bit line bBL2 of the memory array 220 to the reference voltage VbLH during the enhancement stage when the second bit-line isolating circuit 260 isolates the bit line BL2 from the sensing line SA and isolates the complementary bit line bBL2 from the complementary sensing line bSA.

Please note that each of the first transistor P1, the second transistor P2, and the third transistor P3 can be a P-type transistor, but this should not be a limitation of the present invention. In addition, each of the transistors P4, P5, and P6 can be a P-type transistor as well, but the present invention is not limited to this only.

Figure 3:
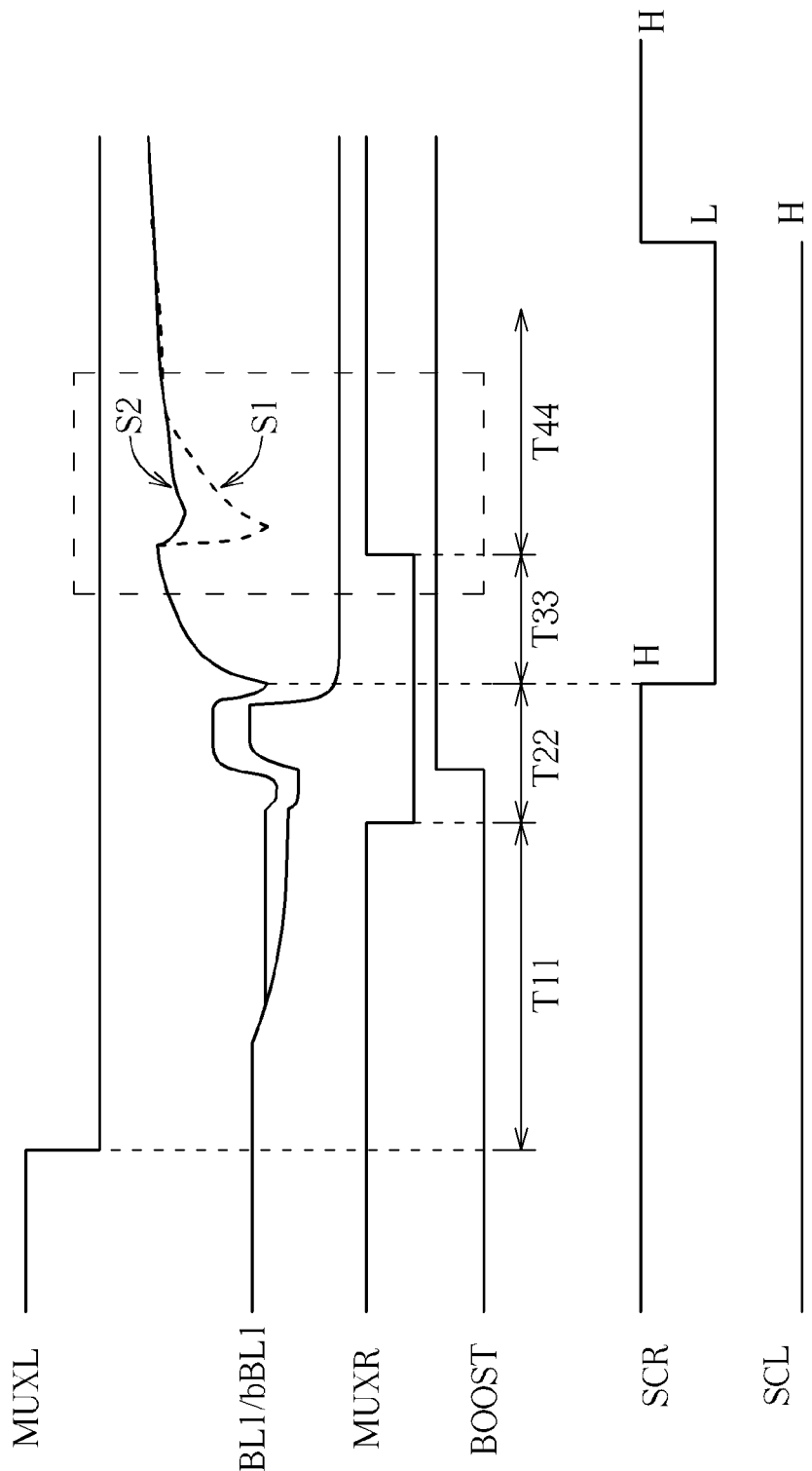
FIG. 3 is a diagram showing the waveforms of the signals shown in FIG. 2.

Please refer to FIG. 3. FIG. 3 is a diagram showing the waveforms of the signals shown in FIG. 2. As shown in FIG. 3, MUXL represents the switch signal for controlling the third switch SW3 and the fourth switch SW4, MUXR represents the switch signal for controlling the first switch SW1 and the second switch SW2, BL1/bBL1 represents the bit line/complementary bit line, BOOST represents a boosting signal for boosting the sensing line SA and the complementary sensing line bSA, SCR represents the first control signal for controlling the first P-sensing enhancement circuit 270, and SCL represents the second control signal for controlling the second P-sensing enhancement circuit 280. At first, the switch signal MUXL is de-asserted. At this time, the bit line BL1 and the complementary bit line bBL1 start to develop, which is also labeled as a duration T11. And then the switch signal MUXR is de-asserted to turn off the first switch SW1 and the second SW2, so that the bit line BL1 is isolated from the sensing line SA and the complementary bit line bBL1 is isolated from the complementary sensing line bSA, which is also labeled as a duration T22. During the duration T22 (which is also called the boosting stage), the bit line/complementary bit line BL1/bBL1 is boosted by the boosting circuit 290. Afterwards, one of the bit line/complementary bit line BL1/bBL1 is pulled up from ½ VbLH to VbLH while the other one of the bit line/complementary bit line BL1/bBL1 is pulled down from ½ VbLH to 0 during a duration T33. At the same time, the first control signal SCR is de-asserted in order to enable the first P-sensing enhancement circuit 270 (including three transistors P1, P2, and P3) and the second control signal SCL is asserted in order to disable the second P-sensing enhancement circuit 280. After that, the switch signal MUXR is asserted again to turn on the first switch SW1 and the second switch SW2, so that the bit line BL1 is re-connected to the sensing line SA and the complementary bit line bBL1 is re-connected to the complementary sensing line bSA, which is also labeled as a duration T44.

Please note that if the first P-sensing enhancement circuit 270 is not added into the sensing amplifier 230, the sensing line/complementary sensing line SA/bSA and the bit line/complementary bit line BL1/bBL1 will have charge sharing during the duration T44. Because the parasitic capacitor (e.g. C2) located on the bit line/complementary bit line BL1/bBL1 is much bigger than the parasitic capacitor (e.g. C1) located on the sensing line/complementary sensing line SA/bSA, a great glitch may appear in the bit line/complementary bit line BL1/bBL1, which can also be labeled as a curve S1. As a result, this may cause false sensing and may increase the recovery time of the bit line/complementary bit line BL1/bBL1.

On the contrary, if the first P-sensing enhancement circuit 270 (including the transistors P1, P2, and P3) is added into the sensing amplifier 230, the aforementioned problem can be solved, which can also be labeled as a curve S2. Because the voltage level of the bit line BL1 or the complementary bit line bBL1 has already been boosted to the reference voltage VbLH by the first P-sensing enhancement circuit 270 during the duration T44, the charge sharing between the sensing line/complementary sensing line SA/bSA and the bit line/complementary bit line BL1/bBL1 can be substantially reduced when the switch signal MUXR is asserted again to turn on the first switch SW1 and the second switch SW2 (i.e., during the duration T44). In other words, by adding the first P-sensing enhancement circuit 270 into the sensing amplifier 230 in the present invention, the transistors P1 and P2 will help to pull up the voltage level of the bit line BL1 or the complementary bit line bBL1 to the reference voltage VbLH. Therefore, not only can the problem of false sensing be avoided but also can the recovery time of the bit line/complementary bit line BL1/bBL1 be improved.

Figure 4:
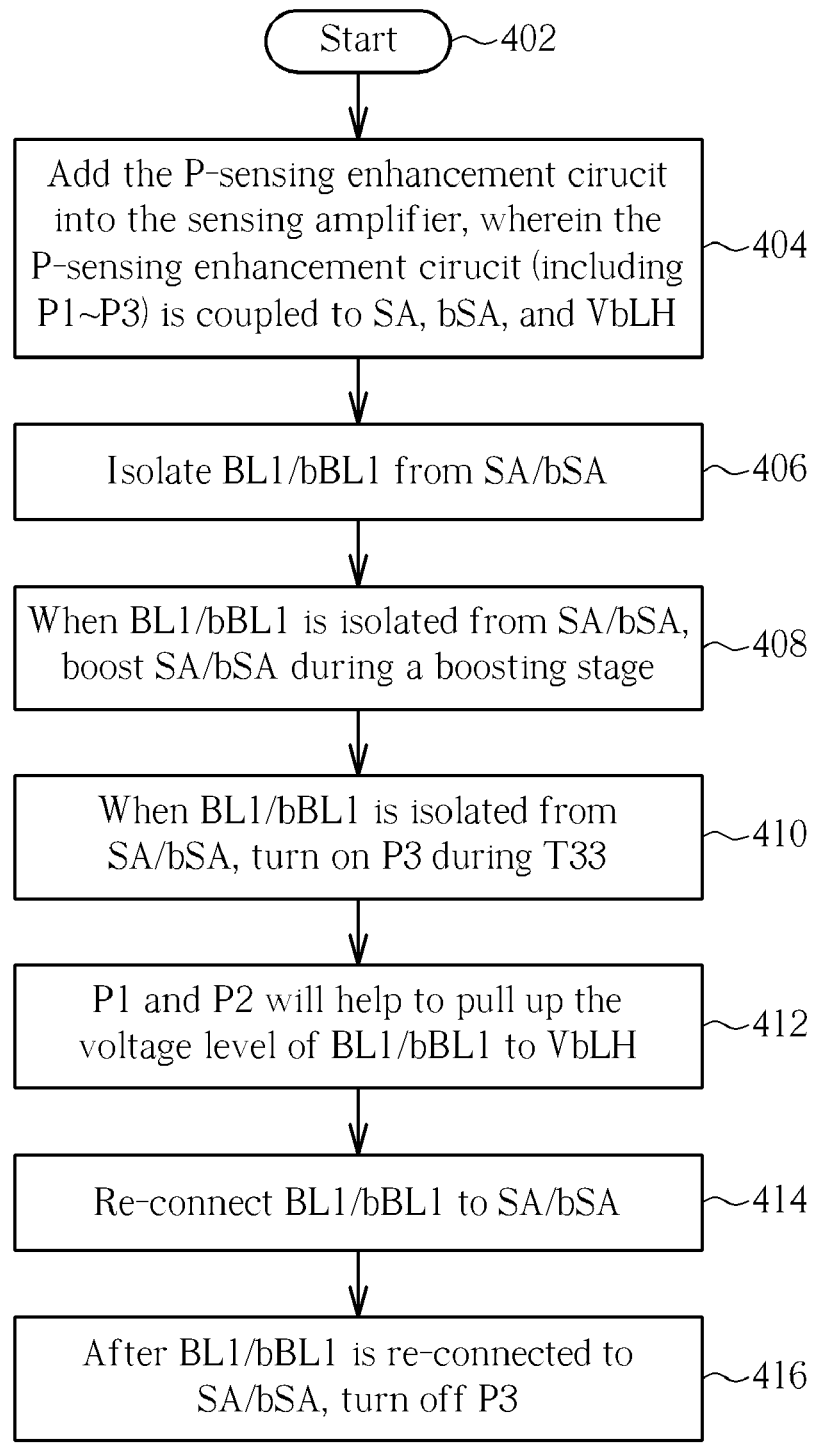
FIG. 4 is a flowchart illustrating an enhancement method for boosting a sensing amplifier applied to at least a memory cell according to an exemplary embodiment of the present invention.

Please refer to FIG. 4. FIG. 4 is a flowchart illustrating an enhancement method for boosting a sensing amplifier applied to at least a memory cell according to an exemplary embodiment of the present invention. Please note that the following steps are not limited to be performed according to the exact sequence shown in FIG. 4 if a roughly identical result can be obtained. The method includes, but is not limited to, the following steps:

Step 402: Start.

Step 404: Add the P-sensing enhancement circuit into the sensing amplifier, wherein the P-sensing enhancement circuit (including the first transistor, the second transistor, and the third transistor) is coupled to the sensing line, the complementary sensing line, and a reference voltage.

Step 406: Isolate the bit line from the sensing line, and isolate the complementary bit line from the complementary sensing line.

Step 408: When the bit line is isolated from the sensing line and the complementary bit line is isolated from the complementary sensing line, boost the sensing line and the complementary sensing line during a boosting stage.

Step 410: When the bit line is isolated from the sensing line and the complementary bit line is isolated from the complementary sensing line, turn on the third transistor by the control signal during the duration T33.

Step 412: The transistors P1 and P2 will help to pull up the voltage level of BL1 or bBL1 to VbLH.

Step 414: Re-connect the bit line to the sensing line, and re-connect the complementary bit line to the complementary sensing line.

Step 416: After the bit line is re-connected to the sensing line and the complementary bit line is re-connected to the complementary sensing line, turn off the third transistor by the control signal.

How each element operates can be known by collocating the steps shown in FIG. 4 and the elements shown in FIG. 2 together with the waveforms shown in FIG. 3. Further description of the operations of each step shown in FIG. 4 is therefore omitted here for brevity. Be noted that the steps 406 and 414 are executed by the first bit-line isolating circuit 250 (or the second bit-line isolating circuit 260). The steps 410, 412 and 416 are executed by the first P-sensing enhancement circuit 270 (or the second P-sensing enhancement circuit 280).

The steps of the flowchart mentioned above are merely a practicable embodiment of the present invention, and should not be taken as a limitation of the present invention. The method can include other intermediate steps or can merge several steps into a single step without departing from the spirit of the present invention.

The abovementioned embodiments are presented merely for describing the features of the present invention, and in no way should be considered to be limitations of the scope of the present invention. In summary, the present invention provides a sensing amplifier, a memory device and a related enhancement method for boosting the sensing amplifier. Because the parasitic capacitor (e.g. C2) located on the bit line/complementary bit line BL1/bBL1 is much bigger than the parasitic capacitor (e.g. C1) located on the sensing line/complementary sensing line SA/bSA, a great glitch may appear in the bit line/complementary bit line BL1/bBL1. By adding the first P-sensing enhancement circuit 270 (including the transistors P1, P2, and P3) into the sensing amplifier 230, the transistors P1 and P2 will help to pull up the voltage level of the bit line BL1 or the complementary bit line bBL1 to the reference voltage VbLH during the duration T44. Therefore, not only can the problem of false sensing be avoided but also can the recovery time of the bit line/complementary bit line BL1/bBL1 be improved. That is, the side effects of the boosting circuit 290 can be improved by adding the first P-sensing enhancement circuit 270 and/or the second P-sensing enhancement circuit 280 into the sensing amplifier 230.

Those skilled in the art will readily observe that numerous modifications and alterations of the device and method may be made while retaining the teachings of the invention.

What is claimed is:

1. A sensing amplifier applied to at least a memory cell coupled to a bit line or a complementary bit line, the sensing amplifier comprising:

a sensing circuit, disposed between a sensing line and a complementary sensing line, for updating data or accessing data of the memory cell;

a boosting circuit, coupled to the sensing line, the complementary sensing line, and the sensing circuit, for boosting the sensing line and the complementary sensing line during a boosting stage;

at least one bit-line isolating circuit, coupled to the sensing circuit, for controlling whether to isolate the bit line from the sensing line and for controlling whether to isolate the complementary bit line from the complementary sensing line; and at least a P-sensing enhancement circuit, coupled to the sensing line, the complementary sensing line, and a reference voltage;

wherein when the bit-line isolating circuit isolates the bit line from the sensing line and isolates the complementary bit line from the complementary sensing line, a voltage level of the bit line or the complementary bit line is pulled up to the reference voltage by the P-sensing enhancement circuit during an enhancement stage.

2. The sensing amplifier of claim 1, wherein the P-sensing enhancement circuit comprises:

a first transistor, having a first end coupled to the bit line, a second end coupled to a first node, and a control end coupled to the complementary sensing line;

a second transistor, having a first end coupled to the first node, a second end coupled to the complementary bit line, and a control end coupled to the sensing line; and a third transistor, having a first end coupled to the reference voltage, a second end coupled to the first node, and a control end for receiving a control signal;

wherein the control signal is used for disabling or enabling the P-sensing enhancement circuit.

3. The sensing amplifier of claim 2, wherein when the bit-line isolating circuit isolates the bit line from the sensing line and isolates the complementary bit line from the complementary sensing line, the third transistor is turned on by the control signal, and the first transistor as well as the second transistor are turned on to pull up the voltage level of the bit line or the complementary bit line to the reference voltage during the enhancement stage.

4. The sensing amplifier of claim 2, wherein after the bit-line isolating circuit re-connects the bit line to the sensing line and re-connects the complementary bit line to the complementary sensing line, the third transistor is turned off by the control signal, and both and the first transistor and the second transistor are turned off by the third transistor.

5. The sensing amplifier of claim 2, wherein each of the first transistor, the second transistor, and the third transistor is a P-type transistor.

6. The sensing amplifier of claim 1, wherein the bit-line isolating circuit comprises:

a first switch, coupled between the bit line and the sensing line, for controlling whether to isolate the bit line from the sensing line; and a second switch, coupled between the complementary bit line and the complementary sensing line, for controlling whether to isolate the complementary bit line from the complementary sensing line.

7. A memory device, comprising:

at least a memory cell, coupled to a bit line or a complementary bit line; and a sensing amplifier, comprising:

a sensing circuit, disposed between a sensing line and a complementary sensing line, for updating data or accessing data of the memory cell;

a boosting circuit, coupled to the sensing line, the complementary sensing line, and the sensing circuit, for boosting the sensing line and the complementary sensing line during a boosting stage;

at least one bit-line isolating circuit, coupled between the sensing circuit and the memory cell, for controlling whether to isolate the bit line from the sensing line and for controlling whether to isolate the complementary bit line from the complementary sensing line; and at least a P-sensing enhancement circuit, coupled to the sensing line, the complementary sensing line, and a reference voltage;

wherein when the bit-line isolating circuit isolates the bit line from the sensing line and isolates the complementary bit line from the complementary sensing line, a voltage level of the bit line or the complementary bit line is pulled up to the reference voltage by the P-sensing enhancement circuit during an enhancement stage.

8. The memory device of claim 7, wherein the P-sensing enhancement circuit comprises:

a first transistor, having a first end coupled to the bit line, a second end coupled to a first node, and a control end coupled to the complementary sensing line;

a second transistor, having a first end coupled to the first node, a second end coupled to the complementary bit line, and a control end coupled to the sensing line; and a third transistor, having a first end coupled to the reference voltage, a second end coupled to the first node, and a control end for receiving a control signal;

wherein the control signal is used for disabling or enabling the P-sensing enhancement circuit.

9. The memory device of claim 8, wherein when the bit-line isolating circuit isolates the bit line from the sensing line and isolates the complementary bit line from the complementary sensing line, the third transistor is turned on by the control signal, and the first transistor as well as the second transistor are turned on to pull up the voltage level of the bit line or the complementary bit line to the reference voltage during the enhancement stage.

10. The memory device of claim 8, wherein after the bit-line isolating circuit re-connects the bit line to the sensing line and re-connects the complementary bit line to the complementary sensing line, the third transistor is turned off by the control signal, and both the first transistor and the second transistor are turned off by the third transistor.

11. The memory device of claim 8, wherein each of the first transistor, the second transistor, and the third transistor is a P-type transistor.

12. The memory device of claim 7, wherein the bit-line isolating circuit comprises:

a first switch, coupled between the bit line and the sensing line, for controlling whether to isolate the bit line from the sensing line; and a second switch, coupled between the complementary bit line and the complementary sensing line, for controlling whether to isolate the complementary bit line from the complementary sensing line.

13. The memory device of claim 7, wherein the memory device is a dynamic random access memory (DRAM).

14. An enhancement method for boosting a sensing amplifier applied to at least a memory cell, the sensing amplifier disposed between a sensing line and a complementary sensing line, and the memory cell coupled to a bit line or a complementary bit line, the enhancement method comprising:

isolating the bit line from the sensing line, and isolating the complementary bit line from the complementary sensing line;

when the bit line is isolated from the sensing line and the complementary bit line is isolated from the complementary sensing line, boosting the bit line and the complementary bit line during a boosting stage; and when the bit line is isolated from the sensing line and the complementary bit line is isolated from the complementary sensing line, pulling up a voltage level of the bit line or the complementary bit line to the reference voltage by a P-sensing enhancement circuit during an enhancement stage, wherein the P-sensing enhancement circuit is coupled to the sensing line, the complementary sensing line, and a reference voltage.

15. The enhancement method of claim 14, wherein the P-sensing enhancement circuit comprises a first transistor, a second transistor, and a third transistor, and the enhancement method further comprises:
connecting a first end of the first transistor to the bit line, connecting a second end of the first transistor to a first node, and connecting a control end of the first transistor to the complementary sensing line;
connecting a first end of the second transistor to the first node, connecting a second end of the second transistor to the complementary bit line, and connecting a control end of the second transistor to the sensing line; and
connecting a first end of the third transistor to the reference voltage, connecting a second end of the third transistor to the first node, and using a control end of the third transistor to receive a control signal;

wherein the control signal is used for disabling or enabling the P-sensing enhancement circuit.

16. The enhancement method of claim 15, further comprising:
when the bit line is isolated from the sensing line and the complementary bit line is isolated from the complementary sensing line, turning on the third transistor by the control signal, and turning on the first transistor as well as the second transistor to pull up the voltage level of the bit line or the complementary bit line to the reference voltage during the enhancement stage.

17. The enhancement method of claim 15, further comprising:
re-connecting the bit line to the sensing line, and re-connecting the complementary bit line to the complementary sensing line; and
after the bit line is re-connected to the sensing line and the complementary bit line is re-connected to the complementary sensing line, turning off the third transistor by the control signal, and turning off both the first transistor and the second transistor by the third transistor.

* * * * *